US012666538B2

(12) United States Patent
Niramarnkarn

(10) Patent No.: US 12,666,538 B2
(45) Date of Patent: Jun. 23, 2026

(54) SYSTEMS AND METHODS FOR AUTOMATED DEGASSING DURING THE MANUFACTURING OF A HIGH SPEED DESIGN

(71) Applicant: Advanced Micro Devices, Inc., Santa Clara, CA (US)

(72) Inventor: Supatta Niramarnkarn, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 223 days.

(21) Appl. No.: 18/307,193

(22) Filed: Apr. 26, 2023

(65) Prior Publication Data

US 2025/0194019 A1      Jun. 12, 2025

(51) Int. Cl.
*H05K 3/00*          (2006.01)
*H05K 3/28*          (2006.01)
(52) U.S. Cl.
CPC ........... *H05K 3/0005* (2013.01); *H05K 3/288* (2013.01)
(58) Field of Classification Search
CPC .... G06F 2115/12; G06F 30/30; G06F 30/367; G06F 30/39; G06F 3/016; G06F 3/0202; G06F 3/04886; H05K 3/0061; H05K 3/4084; H05K 3/284; H05K 3/06; H05K 3/4038; H05K 3/429; H05K 3/4652;

H05K 3/0005; H05K 3/0008; H05K 3/288; H05K 3/445; H05K 3/225; H05K 3/386; H05K 3/3436; H05K 3/3452; H05K 3/4638
USPC .................................................. 716/136–139
See application file for complete search history.

(56) References Cited

U.S. PATENT DOCUMENTS

2007/0284727 A1 * 12/2007 Liao ..................... H05K 1/0298
                                                                257/750
2017/0317057 A1 * 11/2017 Chen ...................... H01L 23/481
2019/0379111 A1 * 12/2019 Varel .................. H01Q 15/0086

* cited by examiner

*Primary Examiner* — Binh C Tat
(74) *Attorney, Agent, or Firm* — Greenberg Traurig, LLP

(57) ABSTRACT

Disclosed is a computer-implemented method for degassing for the manufacture of a high speed design. The method includes analyzing information related to a printed circuit board (PCB) that includes a set of layers and a plurality of voids. The method identifies a void from the plurality of voids, where the void has a position among the PCB set of layers. The method determines a radius associated with the identified void, where the radius is based on a center of the identified void. The method performs a trace selection and executes a shift algorithm based on the trace selection, where the shift algorithm includes a modification of the information related to the void. As a result, the method can generate a grid for degassing based on execution of the shift algorithm. Various other methods, systems, and computer-readable media are also disclosed.

18 Claims, 10 Drawing Sheets

200

300

302 — Analyze a printed circuit board (PCB)

304 — Identify a set of voids associated with the PCB

306 — Determine a radius of the set of voids

308 — Perform a trace selection(s) based on the radius and position of the void respective to the PCB 310 — Execute a shift algorithm based on the trace selection 312 — Generate a grid for degassing

400

402

404

SYSTEMS AND METHODS FOR AUTOMATED DEGASSING DURING THE MANUFACTURING OF A HIGH SPEED DESIGN

BACKGROUND

Degassing (or outgassing, used interchangeably) a multilayer material (e.g., silicon, substrate, printed circuit board (PCB), for example) involves removing any trapped gasses from the material before it is populated with components and assembled. During the manufacture of a PCB, for example, gasses can become trapped within the board in relation to, for example, where the traces are etched. If these gases are not removed, they can cause problems such as, for example, soldering defects, surface contamination, delamination, and the like.

SUMMARY

As will be described in greater detail below, the present disclosure describes various systems and methods for automated degassing during the manufacturing of a high speed design.

According to some implementations, a method is disclosed, which can include analyzing, by a processor, information related to a PCB, the PCB including a set of layers and a plurality of voids; identifying, by the processor, a void from the plurality of voids, the void having a position among the set of layers on the PCB; determining, by the processor, a radius associated with the identified void, the radius based on a center of the identified void; performing, by the processor, a trace selection based on the radius and the position of the void; executing, by the processor, a shift algorithm based on the trace selection, the shift algorithm including a modification of the information related to the void; and generating, by the processor, a grid for degassing based on execution of the shift algorithm.

According to some implementations, the method can further include execution of the shift algorithm, which includes: determining an overlap of the trace selection with the radius of the void; and determining, based on the overlap, a positional value to shift the void.

In some implementations, the modification of the information related to the void includes moving the void to the positional value.

In some implementations, the modification of the information related to the void includes deleting the void and adding a new void based on the positional value.

In some implementations, the positional value includes at least one of an x direction and a y direction.

In some implementations, the execution of the shift algorithm can include: detecting a set of traces overlapping the radius of the void; analyzing the information related to the PCB; and determining, based on the analysis, an empty space at least having an area of the radius.

In some implementations, the modification of the information related to the void includes moving the void within the empty space.

In some implementations, the modification of the information related to the void includes deleting the void and adding a new void within the empty space.

In some implementations, the empty space includes a rectangular shape.

In some implementations, the set of traces includes more than two traces, where a width of at least a portion of the set of traces is reduced at least a threshold value.

In some implementations, the method further includes: identifying a set of voids from the plurality of voids, where the grid is generated based on the identified set of voids.

In some implementations, the method further includes: identifying, by the processor, a computer-aided design (CAD) file, the CAD file including the information related to the PCB.

In one example, a system can include at least one physical processor and physical memory including computer-executable instructions, that when executed by the physical processor, cause the physical processor to execute steps including: analyzing information related to a PCB, the PCB including a set of layers and a plurality of voids; identifying a void from the plurality of voids, the void having a position among the set of layers on the PCB; determining a radius associated with the identified void, the radius based on a center of the identified void; performing a trace selection based on the radius and the position of the void; executing a shift algorithm based on the trace selection, the shift algorithm including a modification of the information related to the void; and generating a grid for degassing based on execution of the shift algorithm.

In some examples, the above-described method can be encoded as computer-readable instructions on a non-transitory computer-readable medium. For example, a computer-readable medium can include one or more computer-executable instructions that, when executed by at least one processor of a computing device, can cause the computing device to perform steps including: analyzing information related to a PCB, the PCB including a set of layers and a plurality of voids; identifying a void from the plurality of voids, the void having a position among the set of layers on the PCB; determining a radius associated with the identified void, the radius based on a center of the identified void; performing a trace selection based on the radius and the position of the void; executing a shift algorithm based on the trace selection, the shift algorithm including a modification of the information related to the void; and generating a grid for degassing based on execution of the shift algorithm.

Features from any of the implementations described herein can be used in combination with one another in accordance with the general principles described herein. These and other implementations, features, and advantages will be more fully understood upon reading the following detailed description in conjunction with the accompanying drawings and claims.

BRIEF DESCRIPTION OF THE DRAWINGS

The accompanying drawings illustrate a number of example implementations and are a part of the specification. Together with the following description, these drawings demonstrate and explain various principles of the present disclosure.

Figure 1:
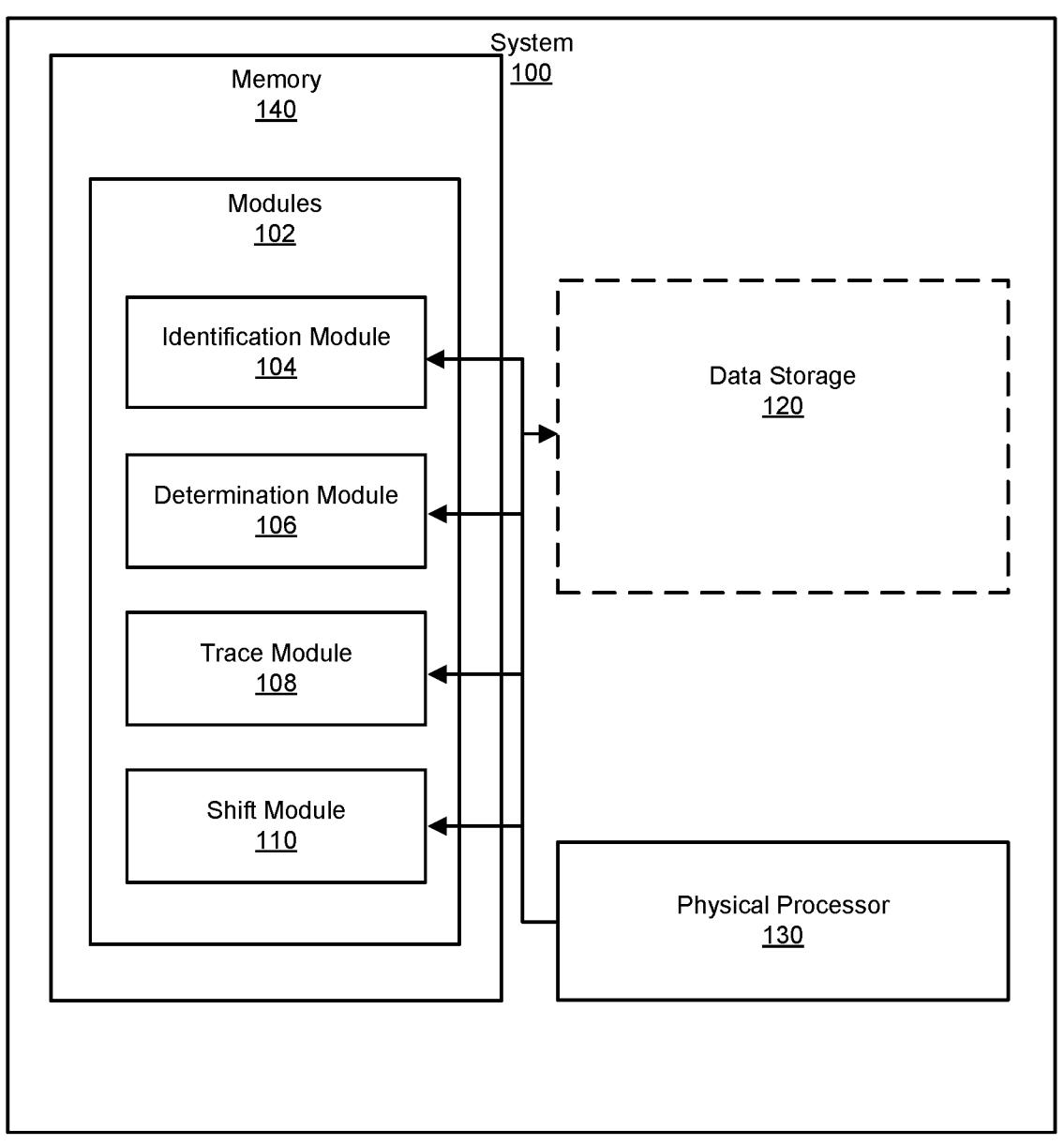
FIG. 1 is a block diagram of an example system for degassing during the manufacturing of a high speed design according to some implementations of the present disclosure.

Throughout the drawings, identical reference characters and descriptions indicate similar, but not necessarily identical, elements. While the example implementations described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

Degassing a multi-layer material (e.g., silicon, substrate, and the like, for example) during manufacturing refers to placement of voids (e.g., lack of metal) throughout the design to allow gas to escape during manufacturing. Without the voids, manufacturing issues may arise. Moreover, when a degassing void overlaps a high speed routing in an adjacent layer of the material, it can negatively impact the performance of the high speed net.

Accordingly, in some implementations as discussed herein, the disclosed systems and methods address these shortcomings, among others, by providing novel mechanisms that enable optimized manufacturing and/or signal integrity of a high speed and/or dense design.

It should be understood that while the disclosure herein will be in reference to a PCB, it should not be construed as limiting, as any other type of known or to be known multi-layer material (e.g., silicon, substrate, and the like) can be utilized via the disclosed systems and methods without departing from the scope of the instant application.

In general, degassing holes are populated as a grid of certain sizes and/or pitches. Many of these degassing holes inevitably overlap with high speed trace routings, which is unwanted, and as mentioned above, can lead to manufacturing defects. Conventional mechanisms for removing the overlapped incidents often result in over removal, which degrades the integrity of the manufacturing. As discussed herein, the disclosed systems and methods provide a methodology to intelligently move and/or change void shapes and/or positions as needed to avoid the voids being overlapped. As evidenced from the instant disclosure, this can remove or at least limit a requirement of a human to spend hours on a small design or days on a large design to move/recreate voids manually. Thus, the disclosed systems and methods can provide a more resource efficient, less human reliant system that improves the accuracy and efficiency in which degassing in manufacturing high speed designs can be effectuated.

Accordingly, as discussed herein, the disclosed systems and methods provide a decision-intelligence (DI)-based framework for intelligently moving and/or shifting degassing holes based on prepopulated grids on PCBs. As provided below, the DI-based framework can algorithmically perform i) shift away mechanisms due to a void being on an edge of a trace; ii) shift into rectangular shape mechanisms between high speed traces with sufficient gaps, iii) shift between high speed traces without sufficient gaps; and iv) shift to an empty shape mass within/on the PCB. Accordingly, while the discussion herein will be based on example traces depicted in the Figures, it should not be construed as limiting. That is, non-limiting example traces depicted in the Figures can correspond to traces that are horizontal, however, traces in other directions, at different angles, and the like, or some combination thereof, can be analyzed respective overlapping voids, inter alia, via the disclosed systems and methods without departing from the scope of the instant disclosure. Thus, while the traces discussed herein may be horizontal, it should be understood that other types of traces are intended to be included, such as, for example, vertical traces, traces with odd angles, traces at industry standard angles (e.g., 45 degrees, for example), arc traces, and the like, or some combination thereof.

Figure 2:
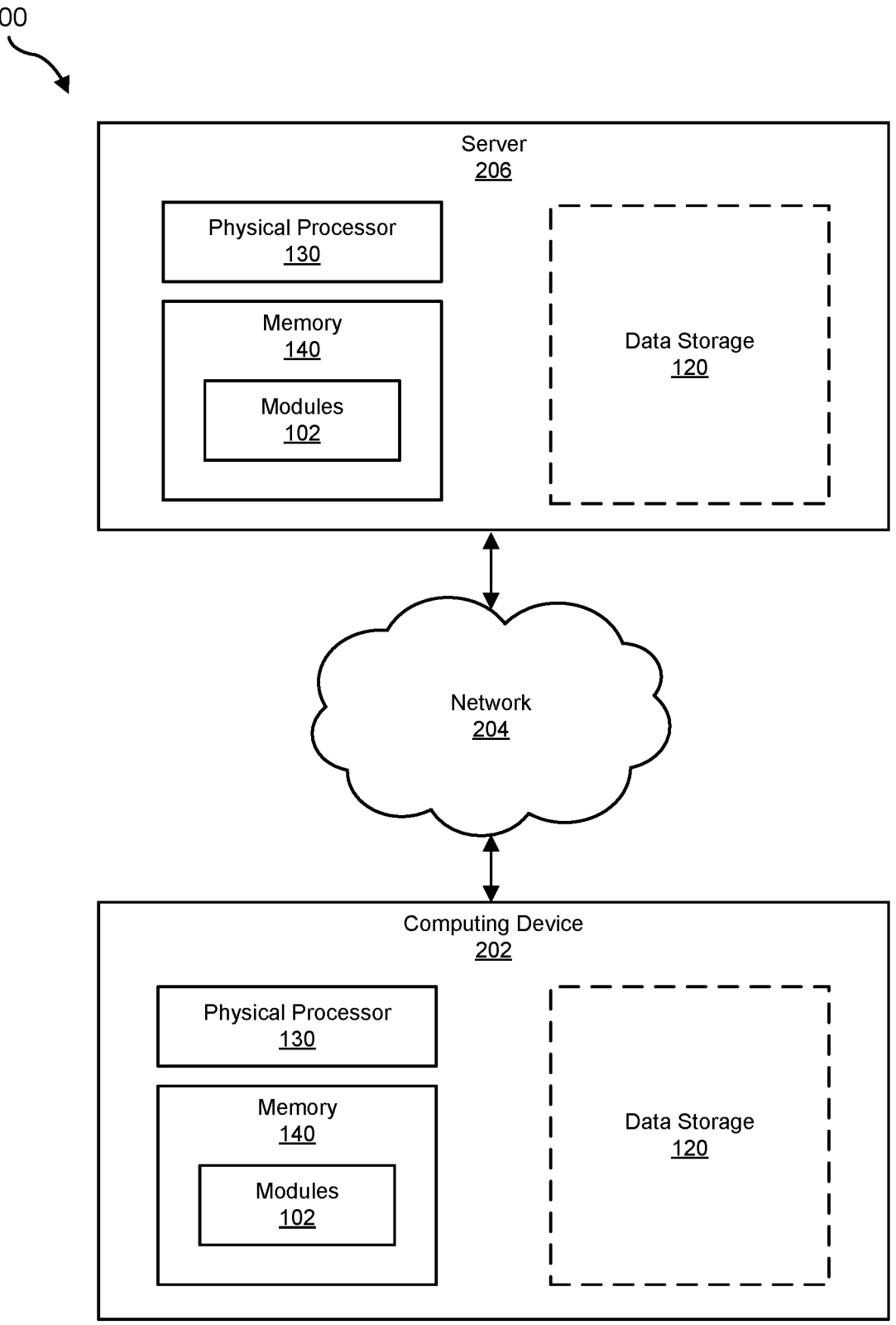
FIG. 2 is a block diagram of an additional example system for degassing during the manufacturing of a high speed design according to some implementations of the present disclosure.
Figure 3:
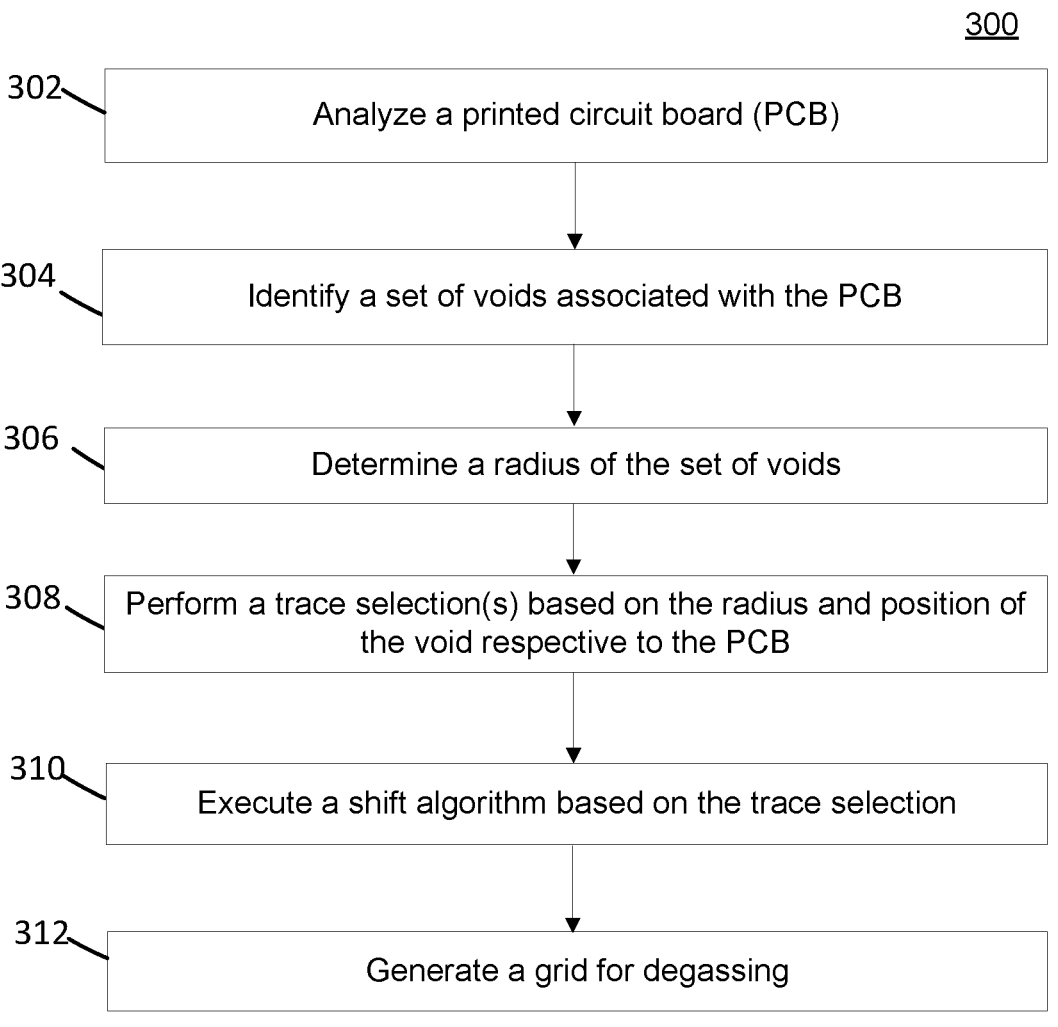
FIG. 3 is a flow diagram of an example method for degassing during the manufacturing of a high speed design according to some implementations of the present disclosure.
Figure 4:
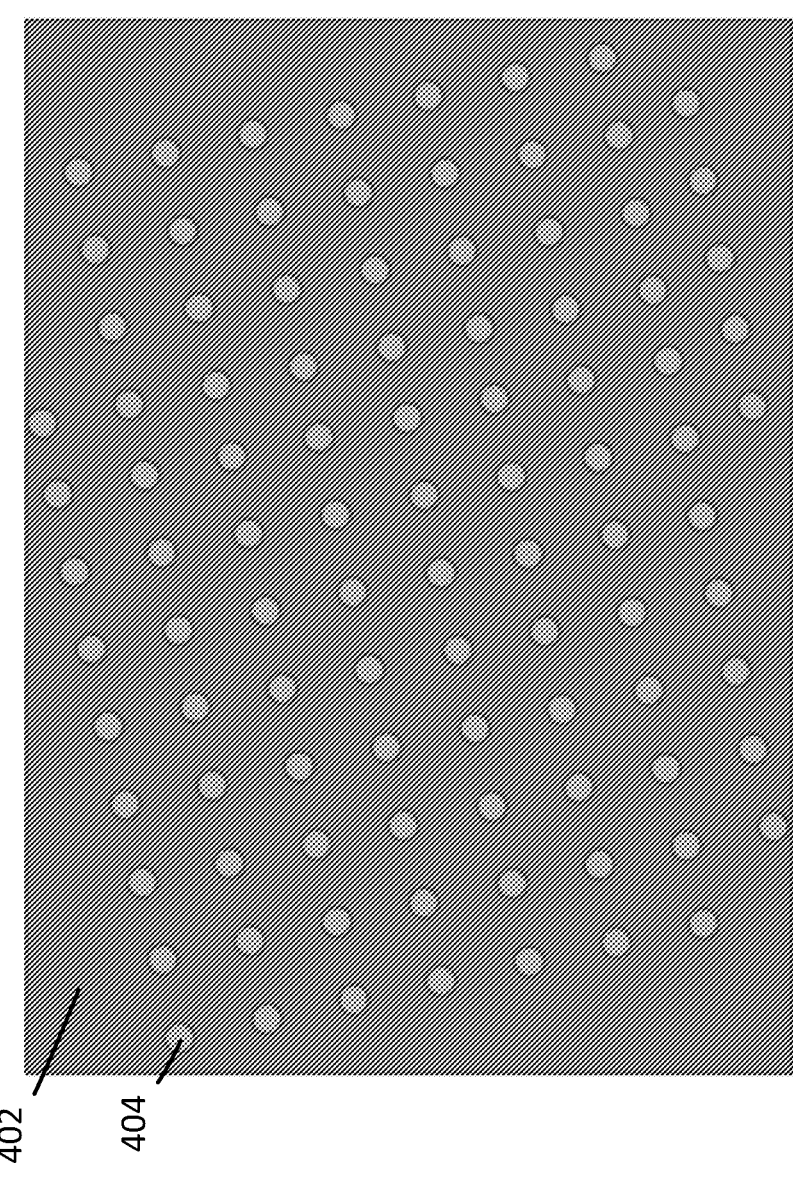
FIG. 4 illustrates an example PCB according to some implementations of the present disclosure.

The following will provide, with reference to FIGS. 1-2, detailed descriptions of example systems for degassing during the manufacturing of a high speed design. Detailed descriptions of corresponding computer-implemented methods will also be provided in connection with FIG. 3. In addition, detailed descriptions of example implementations related to the processing provided in FIG. 3 are provided in FIGS. 4-10.

FIG. 1 is a block diagram of an example system 100 for degassing during the manufacturing of a high speed design. As illustrated in this figure, example system 100 can include one or more modules 102 for performing one or more tasks. As will be explained in greater detail below, modules 102 can include an identification module 104, a determination module 104, a trace module 108 and a shift module 110. Although illustrated as separate elements, one or more of modules 102 in FIG. 1 can represent portions of a single module or application.

In certain implementations, one or more of modules 102 in FIG. 1 can represent one or more software applications or programs that, when executed by a computing device, can cause the computing device to perform one or more tasks. For example, and as will be described in greater detail below, one or more of modules 102 can represent modules stored and configured to run on one or more computing devices, such as the devices illustrated in FIG. 2 (e.g., computing device 202 and/or server 206). One or more of modules 102 in FIG. 1 can also represent all or portions of one or more special-purpose computers configured to perform one or more tasks.

As illustrated in FIG. 1, example system 100 can also include one or more memory devices, such as memory 140. Memory 140 generally represents any type or form of volatile or non-volatile storage device or medium capable of storing data and/or computer-readable instructions. In one example, memory 140 can store, load, and/or maintain one or more of modules 102. Examples of memory 140 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

As illustrated in FIG. 1, example system 100 can also include one or more physical processors, such as physical processor 130. Physical processor 130 generally represents any type or form of hardware-implemented processing unit capable of interpreting and/or executing computer-readable instructions. In one example, physical processor 130 can access and/or modify one or more of modules 102 stored in memory 140. Additionally or alternatively, physical processor 130 can execute one or more of modules 102 to facilitate degassing during the manufacturing of a high speed design. Examples of physical processor 130 include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

As illustrated in FIG. 1, example system 100 can also include one or more instances of stored data, such as data storage 120. Data storage 120 generally represents any type or form of stored data. In one example, data storage 120 includes databases, spreadsheets, tables, lists, matrices, trees, or any other type of data structure. Examples of data storage 120 include, without limitation, input parameters, network shapes, connections, one or more PCB designs, and the like, or some combination thereof.

Example system 100 in FIG. 1 can be implemented in a variety of ways. For example, all or a portion of example system 100 can represent portions of example system 200 in FIG. 2. As shown in FIG. 2, system 200 can include a computing device 202 in communication with a server 206 via a network 204. In one example, all or a portion of the functionality of modules 102 can be performed by computing device 202, server 206, and/or any other suitable computing system. As will be described in greater detail below, one or more of modules 102 from FIG. 1 can, when executed by at least one processor of computing device 202 and/or server 206, enable computing device 202 and/or server 206 to perform degassing during the manufacturing of a high speed design.

Computing device 202 generally represents any type or form of computing device capable of reading computer-executable instructions. For example, computing device 202 is any computer capable of receiving, processing, and storing data. Additional examples of computing device 202 include, without limitation, laptops, tablets, desktops, servers, cellular phones, Personal Digital Assistants (PDAs), multimedia players, embedded systems, wearable devices (e.g., smart watches, smart glasses, etc.), smart vehicles, so-called Internet-of-Things (IoT) devices (e.g., smart appliances, etc.), gaming consoles, variations or combinations of one or more of the same, or any other suitable computing device.

Server 206 generally represents any type or form of computing device that is capable receiving, processing, and storing data. Additional examples of server 206 include, without limitation, storage servers, database servers, application servers, and/or web servers configured to run certain software applications and/or provide various storage, database, and/or web services. Although illustrated as a single entity in FIG. 2, server 206 can include and/or represent a plurality of servers that work and/or operate in conjunction with one another.

Network 204 generally represents any medium or architecture capable of facilitating communication or data transfer. In one example, network 204 can facilitate communication between computing device 202 and server 206. In this example, network 204 can facilitate communication or data transfer using wireless and/or wired connections. Examples of network 204 include, without limitation, an intranet, a Wide Area Network (WAN), a Local Area Network (LAN), a Personal Area Network (PAN), the Internet, Power Line Communications (PLC), a cellular network (e.g., a Global System for Mobile Communications (GSM) network), portions of one or more of the same, variations or combinations of one or more of the same, or any other suitable network.

In various examples, many other devices or subsystems are connected to system 100 in FIG. 1 and/or system 200 in FIG. 2. Conversely, all of the components and devices illustrated in FIGS. 1 and 2 need not be present to practice the implementations described and/or illustrated herein. The devices and subsystems referenced above also are interconnected in different ways from that shown in FIG. 2. Systems 100 and 200 also employ any number of software, firmware, and/or hardware configurations. For example, one or more of the example implementations disclosed herein can be encoded as a computer program (also referred to as computer software, software applications, computer-readable instructions, and/or computer control logic) on a computer-readable medium.

The term "computer-readable medium," as used herein, generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

FIG. 3 is a flow diagram of an example computer-implemented method 300 for degassing during the manufacturing of a high speed design. The steps shown in FIG. 3 can be performed by any suitable computer-executable code and/or computing system, including system 100 in FIG. 1, system 200 in FIG. 2, and/or variations or combinations of one or more of the same. In one example, each of the steps shown in FIG. 3 can represent an algorithm whose structure includes and/or is represented by multiple sub-steps, examples of which will be provided in greater detail below.

According to some implementations, as discussed herein, Steps 302-304 of method 300 can be performed by identification module 104; Step 306 can be performed by determination module 106; Step 308 can be performed by trace module 108; and Steps 310-312 can be performed by shift module 110.

The term "network," as used herein, generally refers to a system of interconnected electronic components or circuits. For example, a network can refer to, without limitation, a communication network and/or a power delivery network implemented on a chip according to system-on-chip methodologies.

The term "network shape," as used herein, generally refers to a region of a layer of an integrated circuit. For example, and without limitation, a network shape can refer to a region of a bump layer and/or a ball-grid array (BGA) layer that is occupied by a network. In some examples, network shapes are geometric shapes. In some of these examples, the geometric shapes are simple polygons (e.g., circles, triangles, squares, rectangles, etc.).

The term "layer," as used herein, generally refers to a layer of an integrated circuit (IC) package. For example, and without limitation, a layer can correspond to a bump layer, a BGA layer, and/or one or more transition layers. In some of these examples, the layers are flat and generally arranged in parallel planes, with a transition layer being disposed between a bump layer and a BGA layer.

The term "integrated circuit package," as used herein, generally refers to a semiconductor device. For example, and without limitation, an IC package can be configured for installation as part of a printed circuit board (PCB). IC packaging indicates the dimension and shape of a chip. Chips with the same electronic parameters often have different IC packages. Typically, IC packages are composed of layers (e.g., bump layer, BGA layer, and one or more transition layers), as described above.

According to some implementations, method 300 begins with Step 302 where a PCB is analyzed. As discussed above, it should be understood that while the discussion herein is based on a PCB, it should not be construed as limiting, as any type of known or to be known multi-layer material (e.g., silicon, for example) used for a high speed design can be utilized herein without departing from the scope of the instant disclosure.

According to some implementations, the PCB can include a set (or plurality) of layers and plurality of voids. For example, as depicted in example 400 of FIG. 4, PCB 402 is depicted with a set of voids, where void 404 provides a non-limiting example of such voids on the PCB 402.

According to some implementations, the analysis performed in Step 302 can involve parsing information related to the PCB and determining a positional value, shape, size, and/or pitch (between/among layers) of each void included on the PCB design. In some implementations, such information can be stored in data storage 120, as discussed above. According to some implementations, such analysis can involve a computational analysis of the PCB board. That is, for example, a computer-aided design (CAD) file can have information related to the layers and voids of the PCB stored thereon. The CAD file can be parsed, whereby such information can be determined.

In some implementations, such computational analysis can involve module 102 (e.g., module 104, for example) implementing any type of known or to be known computational analysis technique, algorithm, mechanism or technology to perform the analysis and subsequent identification/ determination (e.g., via Steps 304 and/or 306, discussed infra).

In some implementations, the computational analysis can include a specific trained artificial intelligence/machine learning model (AI/ML), a particular machine learning model architecture, a particular machine learning model type (e.g., convolutional neural network (CNN), recurrent neural network (RNN), autoencoder, support vector machine (SVM), and the like), or any other suitable definition of a machine learning model or any suitable combination thereof.

In some implementations, the computational analysis can be configured to utilize one or more AI/ML techniques chosen from, but not limited to, computer vision, feature vector analysis, decision trees, boosting, support-vector machines, neural networks, nearest neighbor algorithms, Naive Bayes, bagging, random forests, logistic regression, and the like. By way of a non-limiting example, system 200 can implement an XGBoost algorithm for regression and/or classification to analyze the input parameters and/or PCB data, as discussed herein.

According to some implementations and, optionally, in combination of any embodiment described above or below, a neural network technique can be one of, without limitation, a feedforward neural network, a radial basis function network, a recurrent neural network, a convolutional network (e.g., U-net), or other suitable network. In some implementations and, optionally, in combination of any embodiment described above or below, an implementation of a neural network can be executed as follows:

a. define neural network architecture/model, b. transfer the input data to the neural network model, c. train the model incrementally, d. determine the accuracy for a specific number of timesteps, e. apply the trained model to process the newly-received input data, f. optionally and in parallel, continue to train the trained model with a predetermined periodicity.

In some implementations and, optionally, in combination with any embodiment described above or below, the trained neural network model can specify a neural network by at least a neural network topology, a series of activation functions, and/or connection weights. For example, the topology of a neural network can include a configuration of nodes of the neural network and connections between such nodes. In some implementations and, optionally, in combination of any embodiment described above or below, the trained neural network model can also be specified to include other parameters, including but not limited to, bias values/functions and/or aggregation functions. For example, an activation function of a node can be a step function, sine function, continuous or piecewise linear function, sigmoid function, hyperbolic tangent function, or other type of mathematical function that represents a threshold at which the node is activated. In some implementations and, optionally, in combination of any embodiment described above or below, the aggregation function can be a mathematical function that combines (e.g., sum, product, and the like) input signals to the node. In some implementations and, optionally, in combination of any embodiment described above or below, an output of the aggregation function can be used as input to the activation function. In some implementations and, optionally, in combination of any embodiment described above or below, the bias can be a constant value or function that can be used by the aggregation function and/or the activation function to make the node more or less likely to be activated.

Thus, as a result of the analysis discussed above respective Step 302, a set of voids associated with the PCB can be identified, as in Step 304. Accordingly, the information determined, derived, extracted, or otherwise identified in Step 304 can indicate, but is not limited to, a shape, size, dimensions, pitch, depth, position, and the like, of each void on the PCB.

Figure 5:
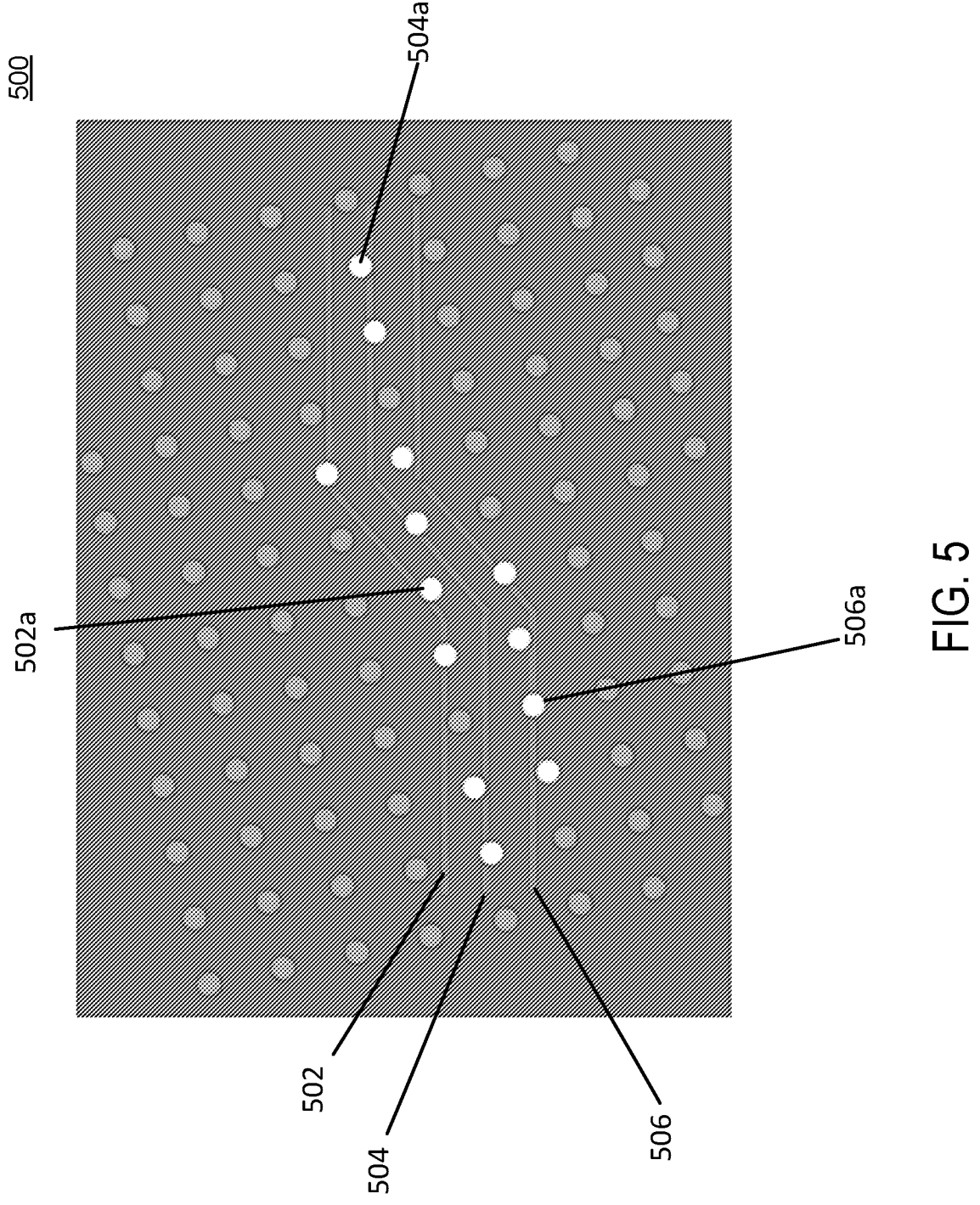
FIG. 5 depicts a set of traces on an example PCB according to some implementations of the present disclosure.

Moreover, in some implementations, Step 304 can involve the identification of voids that overlap trace routings on the PCB. Such overlap can be based on trace selections (or routings) respective to the voids, as discussed herein. For example, as depicted in the example 500 of FIG. 5, shown are trace routings 502, 504 and 506, and corresponding example voids 502a, 504a and 506a. It should be understood that voids 502a, 504a and 506a are illustrative and non-limiting, as depicted in the example 500 of FIG. 5 other voids overlap the trace routings 502, 504 and 506. Thus, as illustrated in FIG. 5, the identified voids from Step 304 can correspond to the voids 502a, 504a and 506a.

Figure 6:
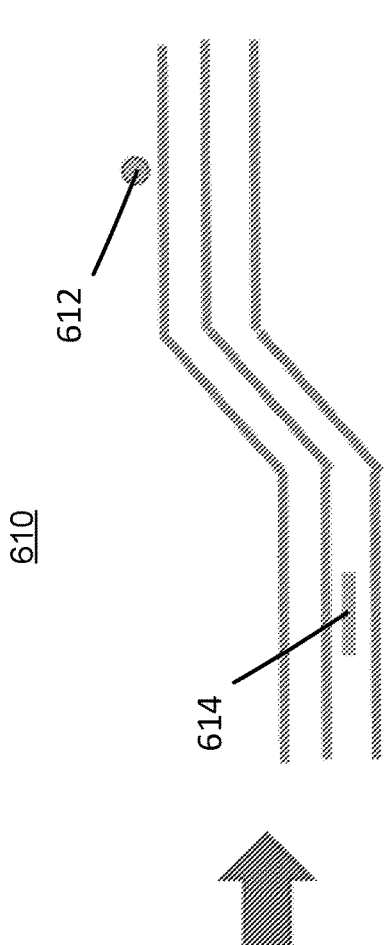
FIG. 6 illustrates a non-limiting example of degassing according to some implementations of the present disclosure.
Figure 6:
Figure 6:
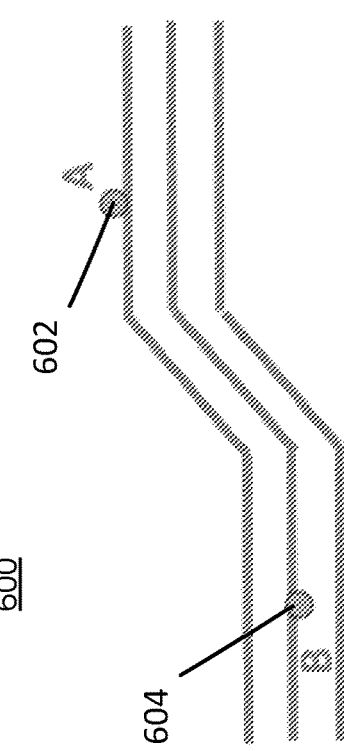

By way of another non-limiting example, in FIG. 6, depicted are examples 600 and 610. In example 600, voids 602 and 604 are shown to overlap trace routings. As provided below, example 610 depicts a result of a shifted/move operation of each void resulting in voids 612 and 614.

Figure 7:
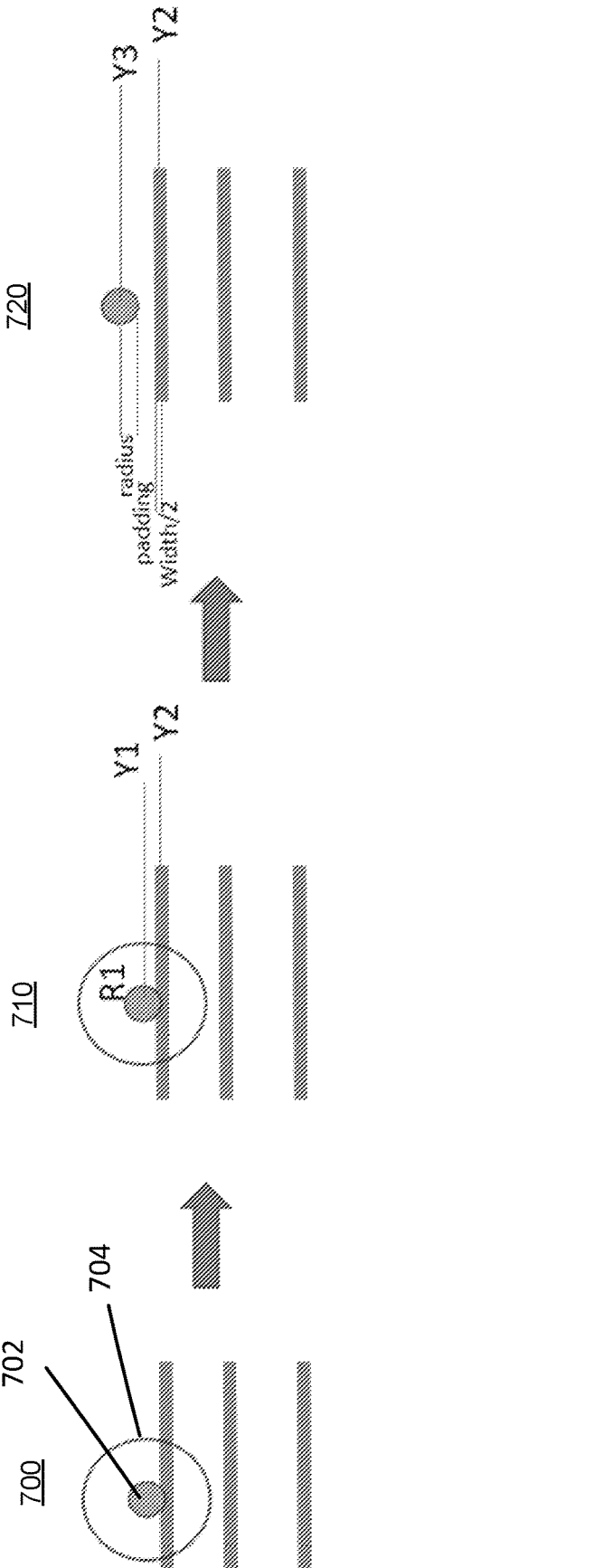
FIG. 7 illustrates a non-limiting example of degassing according to some implementations of the present disclosure.
Figure 8:
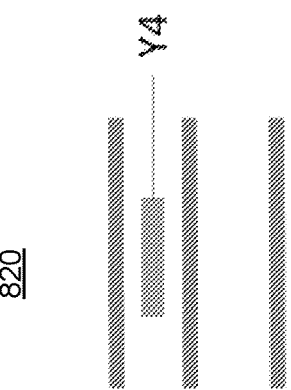
FIG. 8 illustrates a non-limiting example of degassing according to some implementations of the present disclosure.
Figure 8:
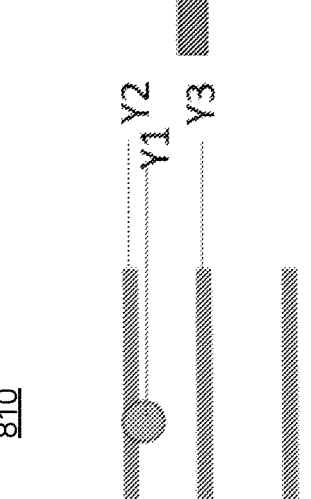
Figure 8:
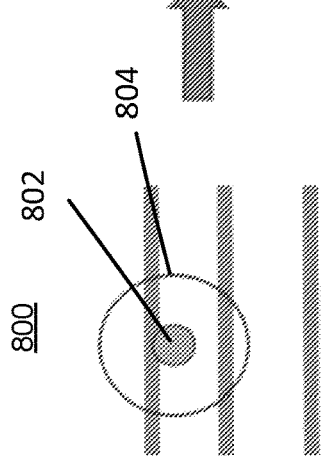
Figure 8:

In Step 306, a determination is made regarding a radius of the set of voids. According to some implementations, the radius is based on a center of the identified void, and corresponds to an established perimeter around a void. For example, a radius can be based on a distance from the circumference to a center of a void, and such distance can be utilized to establish a circumferential perimeter around the void at such distance. A non-limiting example of such distance is depicted in FIG. 7. In example 700 of FIG. 7, void 702 has a perimeter 704. The perimeter is based on a radius R1 of void Y1, as depicted in example 710, which illustrates the trace routing Y2 overlapping the void Y1.

In Step 308, a trace selection is performed based on a position of the set of voids and the perimetrical radius of each. That is, as depicted in example 710 of FIG. 7, a determination is made indicating that void Y1 overlaps trace Y2 (e.g., its perimetrical radius R1 overlaps Y2, as discussed above).

In Step 310, a shift algorithm is executed. As discussed above, the shift algorithm can be a shift away, shift into a rectangular shape, and/or shift to an empty shape mass. The type of shift algorithm can be based on the trace selection; that is, the type of shift algorithm can be based on the manner in which a void overlaps the trace routing, as well as its relationship to other trace routings on the PCB. According to some implementations, Step 310 can involve the determination of the shift algorithm, and then the execution of such identified algorithm to modify the position and/or shape of the void respective to the PCB.

According to some implementations, for a shift away algorithm, Step 310 can involve determining an overlap of the trace selection with the radius of a void, then determining a positional value to shift the void. As depicted in FIG. 7, a trace selection of a certain radius is performed (as in example 700). Then, upon identifying a trace, it is determined that there is enough space (e.g., a predetermined amount of space between traces and/or on the PCB) to perform the shift away algorithm. Accordingly, as in example 710 of FIG. 7, a determination of how much of shift away is required to avoid/prevent an overlap can be performed, which can be based on information related to, but not limited to, a void radius, void (center) Y1, trace Y2. Accordingly, based on such determined distance, as depicted in example 720 of FIG. 7, a void can be moved or deleted and redrawn as a new void. For example, Y3 can be provided (e.g., a movement of void 702 or newly provided void), where if Y1>Y2 then Y3=Y2+trace width/2+radius+padding (as in example 720).

According to some implementations, for a shift into a rectangular shape algorithm, Step 310 can involve determining the voids, overlap trace, and radius of the voids, in a similar manner as discussed above. An example of such is depicted in example 800 of FIG. 8 where void 802, where a perimetrical radius of 804 is depicted to overlap a trace. Example 810 depicts this further via void Y1 overlapping trace Y2 and being (at least partially) between Y2 and Y3.

According to some implementations, since two traces are found (Y1 and Y2), a determination of the center of the traces are performed, where void Y1 is redrawn as a rectangle, as depicted in example 820—void Y4. According to some implementations, a position of void Y4 can be determined via: Y4=(Y2+Y3)/2. Thus, void Y4 can be a result of the deletion of void Y1 and/or the redrawing of Y1 as a rectangle. In some implementations, such analysis and modification can be performed via any of the AI/ML techniques discussed above.

In some implementations, when more than two traces are found (e.g., three or more), Step 310 can modify the traces' width rather than the impacted void. That is, each trace is analyzed to determine their respective width, and the traces can have their widths reduced according to a widest gap between the traces so as to enable the void to fit therein. In some implementations, such width reduction can be based on a predetermined width value. In some implementations, such analysis and modification can be performed via any of the AI/ML techniques discussed above. In some implementations, the void may still need to be modified (e.g., reduce shape and/or size) when the widest gap does not enable placement of the void without an overlap, which can be performed via any of the techniques discussed herein and in more detail below.

Figure 9:
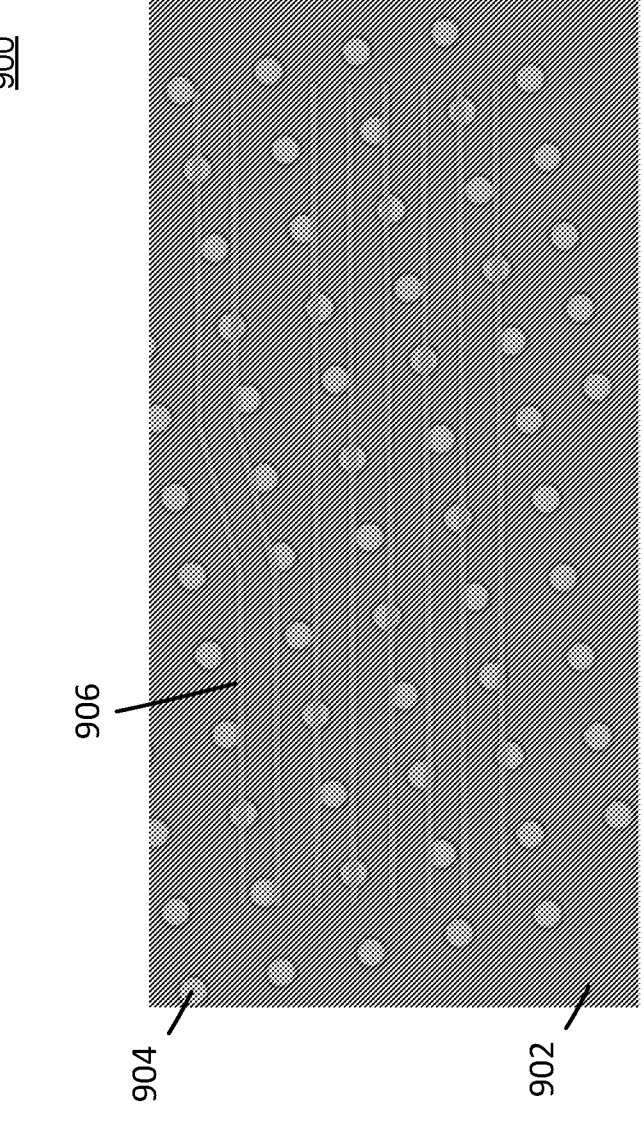
FIG. 9 depicts a set of traces on an example PCB according to some implementations of the present disclosure.
Figure 10:
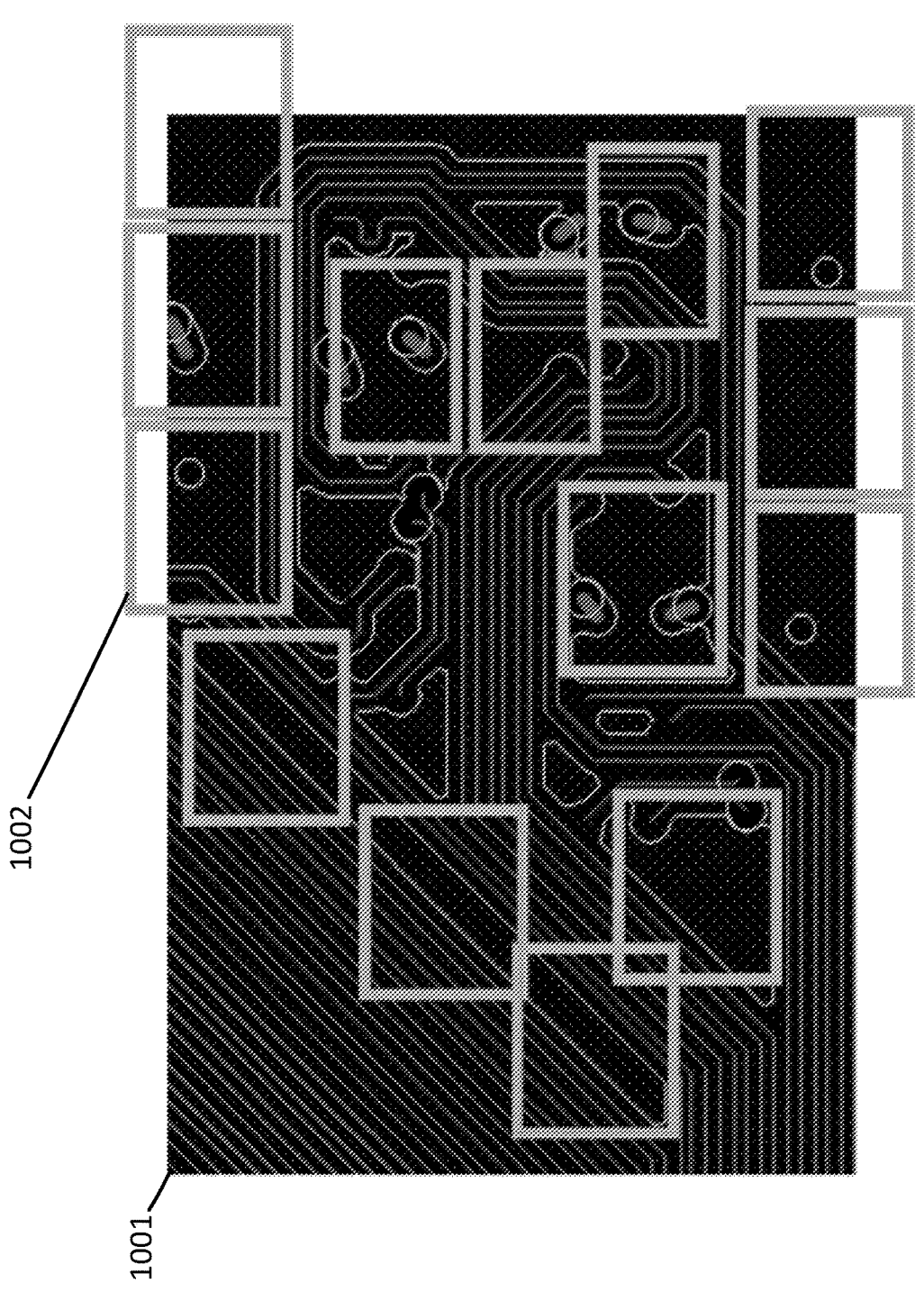
FIG. 10 depicts a non-limiting example of degassing according to some implementations of the present disclosure.

In some implementations, in dense routing areas, it may be difficult to populate the degassing holes because there is not enough room to fit the void in between without an overlap. An example of such is depicted in FIG. 9, which depicts example 900 illustrating PCB 902, example void 904, and example trace 906.

Accordingly, in some implementations, Step 310 can involve identifying shapes near the dense routing area, and for each shape, step through with boxes of desired size, shape, and/or pitch. An example of a set of applied boxes can be found in FIG. 10, where example 1000 depicts PCB 1001 and example box 1002 corresponding to an empty space on the PCB 1001 (e.g., no traces). Accordingly, in some implementations, a determination (e.g., check) can be performed according to whether at least one void already exists within a box, and if not, a void can be moved and/or placed therein (e.g., at the center of the box). If a void already exists within the box, then that box can be ignored and/or removed from processing as a possible relocation place for a void.

Accordingly, upon completion of the placement, movement, and/or reshaping of voids and/or traces, as in Step 310, method 300 can continue to Step 312. In Step 312, a grid for degassing can be generated. Such grid can be electronically compiled and leveraged to generate a physical grid that can be applied to the PCB, thereby creating the physical degassing holes in the PCB according to the void selection/movement (in Step 310, discussed supra).

As such, method 300 provides a non-limiting example embodiment for modifying and/or manipulating voids within layers of a multi-layer high speed design material for the efficient and proper generating of a grid for degassing.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

In some examples, all or a portion of example system 100 in FIG. 1 can represent portions of a cloud-computing or network-based environment. Cloud-computing environments can provide various services and applications via the Internet. These cloud-based services (e.g., software as a service, platform as a service, infrastructure as a service, etc.) can be accessible through a web browser or other remote interface. Various functions described herein can be provided through a remote desktop environment or any other cloud-based computing environment.

In various implementations, all or a portion of example system 100 in FIG. 1 can facilitate multi-tenancy within a cloud-based computing environment. In other words, the modules described herein can configure a computing system (e.g., a server) to facilitate multi-tenancy for one or more of the functions described herein. For example, one or more of the modules described herein can program a server to enable two or more clients (e.g., customers) to share an application that is running on the server. A server programmed in this manner can share an application, operating system, processing system, and/or storage system among multiple customers (i.e., tenants). One or more of the modules described herein can also partition data and/or configuration information of a multi-tenant application for each customer such that one customer cannot access data and/or configuration information of another customer.

According to various implementations, all or a portion of example system 100 in FIG. 1 can be implemented within a virtual environment. For example, the modules and/or data described herein can reside and/or execute within a virtual machine. As used herein, the term "virtual machine" generally refers to any operating system environment that is abstracted from computing hardware by a virtual machine manager (e.g., a hypervisor).

In some examples, all or a portion of example system 100 in FIG. 1 can represent portions of a mobile computing environment. Mobile computing environments can be implemented by a wide range of mobile computing devices, including mobile phones, tablet computers, e-book readers, personal digital assistants, wearable computing devices (e.g., computing devices with a head-mounted display, smartwatches, etc.), variations or combinations of one or more of the same, or any other suitable mobile computing devices. In some examples, mobile computing environments can have one or more distinct features, including, for example, reliance on battery power, presenting only one foreground application at any given time, remote management features, touchscreen features, location and movement data (e.g., provided by Global Positioning Systems, gyroscopes, accelerometers, etc.), restricted platforms that restrict modifications to system-level configurations and/or that limit the ability of third-party software to inspect the behavior of other applications, controls to restrict the installation of applications (e.g., to only originate from approved application stores), etc. Various functions described herein can be provided for a mobile computing environment and/or can interact with a mobile computing environment.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

While various implementations have been described and/or illustrated herein in the context of fully functional computing systems, one or more of these example implementations can be distributed as a program product in a variety of forms, regardless of the particular type of computer-readable media used to actually carry out the distribution. The implementations disclosed herein can also be implemented using modules that perform certain tasks. These modules can include script, batch, or other executable files that can be stored on a computer-readable storage medium or in a computing system. In some implementations, these modules can configure a computing system to perform one or more of the example implementations disclosed herein.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
analyzing, by a processor, information related to a material comprising a set of layers and a plurality of voids;
identifying, by the processor, a void from the plurality of voids, the void having a position among the set of layers on the material;
determining, by the processor, an area associated with the void, the area based on a center of the void;
performing, by the processor, a trace selection based on the area and the position of the void;
executing, by the processor, a modification of the information related to the void based on the trace selection; and
generating, by the processor, a grid for degassing based on the modification.

2. The method of claim 1, wherein the modification of the information related to the void comprises:
determining an overlap of the trace selection with the area of the void; and
determining, based on the overlap, a positional value to shift the void.

3. The method of claim 2, further comprising:
moving the void to the positional value.

4. The method of claim 2, further comprising:
deleting the void; and
adding a new void based on the positional value.

5. The method of claim 2, wherein the positional value comprises at least one of an x direction and a y direction.

6. The method of claim 1, wherein the modification of the information related to the void comprises:
detecting a set of traces overlapping the area of the void; and
analyzing the information related to the material, and determining, based on the analysis, an empty space at least having an area of the area.

7. The method of claim 6, further comprising:
moving the void within the empty space.

8. The method of claim 6, further comprising:
deleting the void; and
adding a new void within the empty space.

9. The method of claim 6, wherein the empty space comprises a rectangular shape.

10. The method of claim 6, wherein the set of traces comprises more than two traces, wherein a width of at least a portion of the set of traces are reduced at least a threshold value.

11. The method of claim 1, further comprising:
identifying a set of voids from the plurality of voids, wherein the grid is an updated grid generated based on a grid having a plurality of voids on a printed circuit board.

12. The method of claim 1, further comprising:
identifying, by the processor, a computer-aided design (CAD) file, the CAD file comprising the information related to the material.

13. The method of claim 1, wherein the area associated with the void is based on a radius respective to the center of the void.

14. The method of claim 1, wherein the material is at least one of a printed circuit board (PCB), substrate and silicon.

15. A system comprising:
at least one physical processor; and
physical memory comprising computer-executable instructions that, when executed by the physical processor, cause the physical processor to:
analyze information related to a material comprising a set of layers and a plurality of voids;
identify a void from the plurality of voids, the void having a position among the set of layers on the material;

determine an area associated with the void, the area based on a center of the void;
perform a trace selection based on the area and the position of the void;
execute a modification of the information related to the void based on the trace selection; and
generate a grid for degassing based on the modification.

16. The system of claim 15, wherein the instructions further cause the physical processor to:
determine an overlap of the trace selection with the area of the void; and
determine, based on the overlap, a positional value to shift the void, wherein the modification of the information related to the void comprises causing the physical processor to:
move the void the positional value, and
delete the void and add a new void based on the positional value.

17. The system of claim 15, wherein the instructions further cause the physical processor to:
detect a set of traces overlapping the area of the void; and
analyze the information related to the material, and determining, based on the analysis, an empty space at least having an area of the area, wherein the modification of the information related to the void comprises causing the physical processor to:
move the void within the empty space, and
delete the void and add a new void within the empty space.

18. The system of claim 15, wherein the area associated with the void is based on a radius respective to the center of the void.

* * * * *